United States Patent [19]

Kusunoki

[11] Patent Number: 5,406,151

[45] Date of Patent: Apr. 11, 1995

[54] SEMICONDUCTOR SWITCHING CIRCUIT

[75] Inventor: Shigeo Kusunoki, Kanagawa, Japan

[73] Assignee: Sony Corporation, Tokyo, Japan

[21] Appl. No.: 122,840

[22] Filed: Sep. 15, 1993

[30] Foreign Application Priority Data

Sep. 24, 1992 [JP] Japan ................................. 4-277667

[51] Int. Cl.⁶ ........................................ H03K 17/687
[52] U.S. Cl. ..................................... 327/427; 327/543
[58] Field of Search ................ 307/571, 572, 296.03, 307/296.04, 296.05, 296.08, 296.01

[56] References Cited

U.S. PATENT DOCUMENTS

| 4,837,530 | 6/1989 | Kondoh | 333/81 |
| 5,066,873 | 11/1991 | Chan | 307/296.8 |
| 5,128,556 | 7/1992 | Hirakata | 307/296.8 |

FOREIGN PATENT DOCUMENTS

| 2137855 | 10/1984 | United Kingdom | 307/296.3 |
| 723782 | 3/1980 | U.S.S.R. | 307/571 |

OTHER PUBLICATIONS

An X-Band Transmit-Receive Switch Using Fets Connected In Series And Shunt, Matsunaga et al., Mitsubishi Electric Corp., MW87-65, pp. 1-4, '92 7.9.

Primary Examiner—William L. Sikes
Assistant Examiner—Tiep H. Nguyen
Attorney, Agent, or Firm—Jerry A. Miller

[57] ABSTRACT

A semiconductor switching circuit for operation at low battery voltages as in, for example, battery powered telephone devices. The semiconductor switching circuit includes first and second field effect transistors. Three power supplies are provided. The first power supply outputs a voltage $V_o$. The second power supply outputs a voltage which is no lower than the sum of $V_o$ and the built in voltage of the field effect transistors. The third power outputs a voltage which is not higher than the sum of $V_o$ and the pinchoff voltage of the field effect transistors. The source of the first field effect transistor serves as the circuits input while its drain serves as the circuit's output. This output is connected to the drain of the second transistor. The first power supply provides bias to the first and second field effect transistors. This arrangement provides low input loss and high isolation.

16 Claims, 3 Drawing Sheets

SEMICONDUCTOR SWITCHING CIRCUIT

BACKGROUND OF THE INVENTION

1. Field of The Invention

The present invention relates to a semiconductor switching circuit, and more particularly to a semiconductor switching circuit which can operate at low voltages.

2. Description of the Related Art

Currently, with car telephones, portable telephones and other portable communications items, the existing radio wave frequency bands are not sufficient due to the increase in users. Herein, a number of new communications services have been started. These communications services are digital communications services which commonly use quasi microwaves (0.8 to 20 GHz).

For example, the portable telephone, which is an alternative to the conventional cordless telephone, is a telephone which uses quasi microwaves for digital communications. However, development of microwave ICs (MMIC: monolithic microwave ICs) which can be used with this frequency band has been slow. It is therefore essential that portable communications terminals are small as it is very important for them to be portable. There is therefore a significant problem with regards to the ICs used in this electronic equipment.

If it is premised that portable communications terminals are battery driven, it is inevitable that the electronic equipment used will be driven by a battery output voltage. Therefore, as battery output voltages are usually low, for example, as with a switch used in a antennae duplexer, the characteristics of the field effect transistor (FET) used will be problematic if used with a drive point which varies greatly. Namely, in order to switch this switch, the FET gate bias voltage has to be greatly varied. It is therefore necessary that when the switch is on, the signal flowing through the FET is not degraded and when the switch is off, there is no signal discharge through the FET.

Semiconductor switching circuits employed in the quasi-microwave region are disclosed in, for example, "TR switches with X band FETs connected in series and parallel" by Makoto Matsunaga et.al, in the study report MW 87-65 published by The Institute of Electronics, Information and Communication Engineers. This semiconductor switching circuit is made up of a first GaAs MESFET input into the signal circuit in series and a second GaAs MESFET input into the signal circuit in parallel. A resonant coil is then connected between the source and drain regions of these FETs. When the switching circuit is on, the first FET is turned on and the second FET is turned off. When the switch is off, the first FET is turned off and the second FET is turned on.

The same gate bias voltage $\Delta V_G$ is then applied to the gate electrodes of the first and second FETs. When the switching circuit is on, $\Delta V_G = 0$ volts and when the switching circuit is off, $\Delta V_G = -5$ volts. Also, $V_p$ (the pinch off voltage) is considered to be on the order of $-3$ volts.

In order for the signal loss in the FET to be small, i.e. in order for the FET input loss to be small, it is necessary for the FET channel resistance to be small. The channel resistance can be shown to be $I_p/V_p$ i.e. the linear region of the drain current $I_p$ against the drain voltage $V_D$ characteristic for a predetermined built in voltage $V_p$. This FET channel resistance is small when $I_p/V_p$ is large. Also, $I_D/V_D$ is large when the built in voltage $V_b$ is large. It therefore follows that if the built in voltage $V_b$ is large, the FET channel resistance becomes low and the signal loss in the FET i.e. FET input loss becomes low.

In the semiconductor switching circuit in the publication disclosed above, $V_p$ is set to a large negative value. This is because if the pinch off voltage $V_p$ is set to its maximum value, $\Delta V_G$ can be set to its maximum value so that a low channel resistance (FET input loss) can be achieved i.e. the FET input loss is a function of the pinch off voltage $V_p$.

In order for the semiconductor switching circuit to be turned off, it is necessary for the gate bias voltage $\Delta V_G$ to be lower than the pinch off voltage $V_p$. It follows that when using the semiconductor switching circuit of the aforementioned publication in, for example, a portable telephone, a low input loss is realized. Moreover, in order for the semiconductor switching circuit to switch completely off, a power supply output voltage of about $-5$ volts is necessary. This is a major difficulty if the circuit is to be driven using usual battery output voltages.

Also, with Si system semiconductor elements employing a frequency of about 20 MHz it is necessary for the semiconductor switching circuit to operate at usual battery output voltages. Currently, mechanical switches made from items such as relays are used to cut the main flow but these switches are large and require a large amount of electrical power presenting the problem that the circuitry cannot be integrated.

SUMMARY OF THE INVENTION

It is a first object of this invention to provide a semiconductor switching circuit which can operate at a usual battery output voltage of, for example, 3 volts.

It is a second object of this invention to provide a semiconductor switching circuit for which the input loss is low and the isolation is high.

It therefore follows that a semiconductor switching circuit for the present invention is comprised of:
 first and second field effect transistors of built in voltage $V_b$ and pinch off voltage $V_p$;
 a first power supply for outputting a voltage $V_O$;
 a second power supply for outputting a voltage which is not lower than the sum of the voltages $V_O$ and $V_b$;
 a third power supply for outputting a voltage which is not higher than the sum of the voltages $V_O$ and $V_p$;
 one of either the source terminal or the drain terminal of the first field effect transistor being a signal input terminal and the remainder being a signal output terminal;
 the output terminal being connected to one of either the source terminal or the drain terminal of the second field effect transistor; and
 the first power supply being connected to the sources and the drains of the first and second field effect transistors;
 whereby when the first field effect transistor is on, the gate electrode of the first field effect transistor is connected to the second power supply and the gate electrode of the second field effect transistor is connected to the third power supply, and when the first field effect transistor is off, the gate electrode of the first field effect transistor is connected to the third power supply and the gate electrode of the second field effect transistor is connected to the second power supply.

The preferred conditions for the semiconductor switching circuit in the present invention are a built in voltage $V_b$ of greater than 1 volt, a pinch off voltage $V_p$ of greater than $-1$ volt and less than zero volts. Junction type field effect transistors are preferred for the first and second field effect transistors. Further, it is preferable if the first power supply is connected to the source and drains of the first and second field effect transistors via ferroelectric elements and that there is a capacitor connected between the other transistor source or drain side of the second field effect transistor and earth (signal ground).

In the semiconductor switching circuit in the present invention, when the switching circuit is on, the first field effect transistor (FET) is turned on, and the second FET is turned off. This has the result that the signal will flow from one source or drain side of the first FET to the other source or drain side of the first FET. Also, when the switch circuit is off, the first FET is turned off, and the second FET is turned on. This means that leakage signal which flows from one source or drain side of the first FET to the other source or drain side of the first FET flows into the second FET, and the isolation of the switching circuit is increased.

Also, the first and second FETs are controlled by the first, second and third power supplies. The built in voltage $V_b$ and the pinch off voltage $V_p$ can then be made about 1 volt at most, so that the first, second and third power supplies can then output usual battery output voltages.

If a junction FET is chosen as the FET (JFET) the built in voltage can be greater than 1 volt and by making the channel resistance lower than that of, for example, an MESFET, the FET input loss can be made lower than that of an MESFET.

DETAILED DESCRIPTION OF THE PREFERRED EMBODIMENTS Embodiment

The following, based on an embodiment, is a description with reference to the diagrams of the semiconductor switching circuit for this invention.

Figure 1:
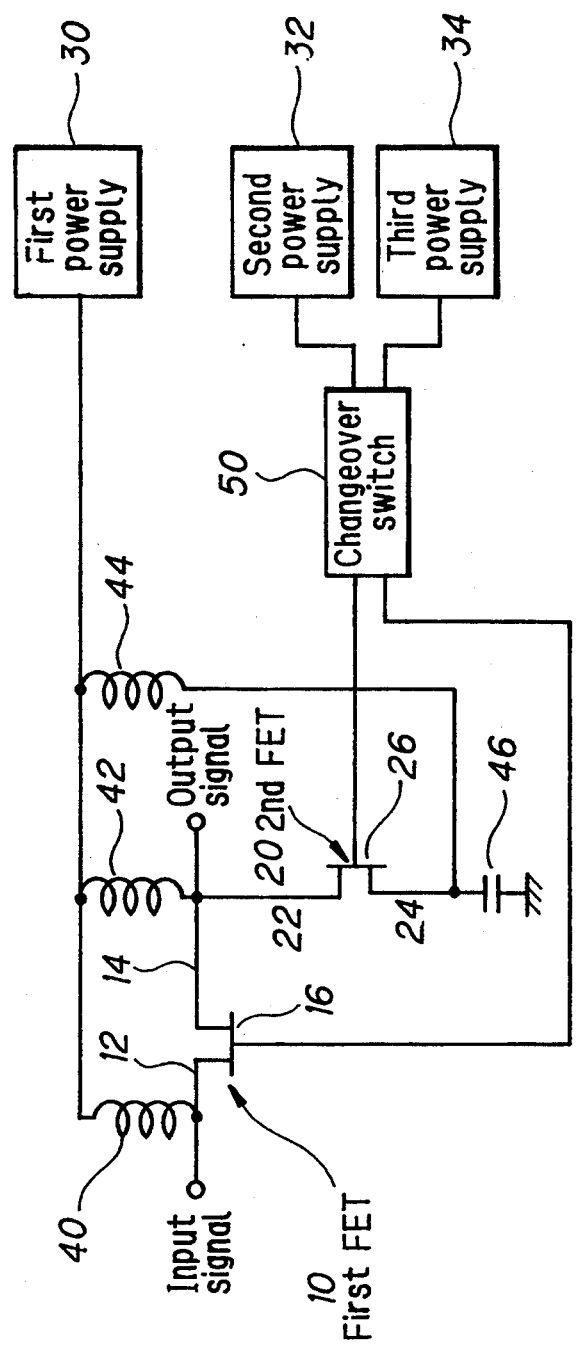
FIG. 1 is a block diagram of the semiconductor switching circuit for the present invention.

FIG. 1 is a block diagram of the semiconductor switching circuit for this invention. The semiconductor switching circuit is made up of a first FET 10, second FET 20, first power supply 30, second power supply 32 and third power supply 34. The first and second FETS are GaAs JFETS, with the built in voltage of these FETS $V_b$ being 1 volt, and the pinch off voltage being $-1$ volts. Also, the built in voltage $V_b$ and the pinch off voltage $V_p$ do not have to be the same for the first FET and the second FET.

The output voltage $V_O$ for the first power supply 30 was 2 volts, the output voltage for the second power supply 32 was 3 volts and the output voltage for the third power supply 34 was zero volts. The voltage for the second power supply is the same as $V_O+V_b$. Also, the voltage for the third power supply is lower than $V_O+V_p$.

The signal is input via the first source or drain side 12 of the first FET 10 and is output from the other source or drain side 14 which is electrically connected to the first source or drain side 22 of the second FET 20.

The first power supply 30 is connected to the first source or drain side 12 of the first FET 10 via a ferroelectric element 40 as well as being connected to the other source or drain side 14 of the first FET 10 and to the first source or drain side 22 of the second FET 20 via a ferroelectric element 42. It is also connected to the other source or drain side 24 of the of the second FET 20 via a ferroelectric element 44. The positioning of these ferroelectric elements prevents the input signal from leaking into the first power supply 30. The inductance of the ferroelectric elements was 10 nH. The ferroelectric elements can be made from wire which has been forced into a suitable shape.

The other source or drain side of the second FET 20 is then connected to earth via a capacitor 46 having a capacitance of 55 pF. The positioning of this capacitor 46 prevents the current flowing during normal operation from the first power supply 30 via the ferroelectric element 44 directly to ground.

The changeover switch 50 can change over the second and third power supplies in, for example, 10 microseconds.

Figure 2:
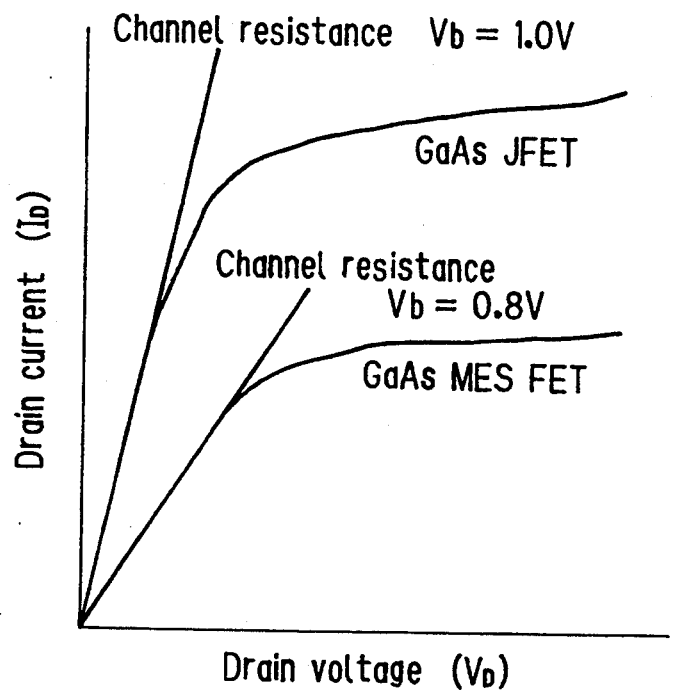
FIG. 2 is a graph showing the relationship between the drain current $I_p$ and the drain voltage $V_p$ for different values of the built in voltage $V_b$.

Usually, when an FET is on, the voltage applied to the gate is usually higher than the voltage applied to the source or drain. FIG. 2 is a graph showing the relationship between the drain current $I_p$ and the drain voltage $V_p$ for different values of the built in voltage $V_b$. As explained previously, the channel resistance can be described by the linear sloping region $I_p/V_p$ of the $I_p-V_p$ characteristics, and the FET channel resistance decreases as $I_p/V_p$ increases.

It follows that when the built in voltage is large, the channel resistance is small. It is therefore necessary for the channel resistance to be low to give low input loss and thus give the switching circuit preferable "on" characteristics.

The built in voltage $V_b$ usually has a maximum value of 0.8 volts in the widely used GaAsMESFETS. With regards to this, GaAs JFETS have a maximum built in voltage $V_b$ of 1.0 volts. It follows that it is preferable to have JFETS as the FETS as these can attain a low input loss.

The following is an explanation of the operation of the semiconductor switching circuit shown in FIG. 1.

When the switching circuit is on, the changeover switch 50 connects the second power supply 32 to the gate electrode 16 for the first FET 10 and the third power supply 34 to the gate electrode 26 of the second FET 20. A voltage of 2 volts is applied to the source and drain 12, and 14, of the first FET 10 and the source and drain 22 and 24 of the second FET 20 by the first power supply 30. A voltage of 3 volts from the second power supply is applied to the gate electrode 16 of the first FET 10, so that the first FET 10 is on. Also, a voltage of zero volts from the third power supply is applied to the gate electrode 26 of the second FET 20. As there is a voltage of 2 volts applied to the source and drain of the second FET 20, the relative voltage at the gate when viewed from the source and drain is −2 volts, which is lower than $V_p(-1\text{volt})$ and therefore means that the second FET is off.

This means that signal will flow from the source or drain side 12 of the FET 16 to the source or drain side 14, but will not flow through the second FET 20.

When the switching circuit is off, the changeover switch 50 connects the third power supply 34 to the gate electrode 16 for the first FET 10 and the second power supply 32 to the gate electrode 26 of the second FET 20. A voltage of zero volts from the third power supply is applied to the gate electrode 16 of the first FET 10, so that the first FET 10 is off. Also, as a voltage of 3 volts from the second power supply is applied to the gate electrode 26 of the second FET 20 the second FET 20 is on.

It therefore follows that the signal is cut off by the FET 10. This is to say that usually, even if the first FET is turned off, as the isolation of the first FET 10 is insufficient, signal flows slightly in the first FET 10 and will therefore leak through to the other source or drain side of the first FET 10.

At the same time, as the second FET 20 is on, the leakage signal will flow down to earth through the second FET 20.

The isolation of the semiconductor switching circuit is determined by the impedance between the source and drain of the first FET 10 in the off state, and the channel resistance of the second FET 20 in the on state. Therefore, if the channel resistance of the second FET 20 is low, the isolation of the semiconducting switching circuit can be made high. By connecting the second FET in this way, the source or drain 14 of the first FET 10 is effectively connected to ground through second FET 20 enhancing the circuit's isolation.

Figure 3:
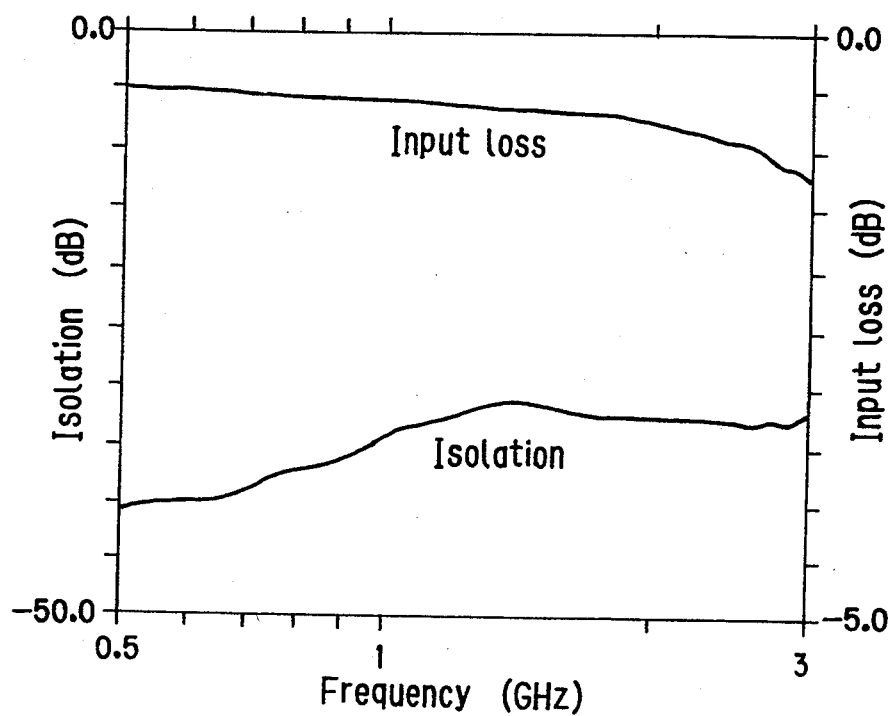
FIG. 3 is a graph showing the characteristics of the semiconductor switching circuit for the present invention.

FIG. 3 is a graph showing the characteristics of the semiconductor switching circuit for the present invention. If the electrical power input to the switching circuit is $P_{in}$ and the electrical power outputted is $P_{out}$, it can be shown that the switch circuit input loss when the switch circuit is on is:

*input loss* = 10 *log* $(P_{out}/P_{in})$.

Also, in the same way, it can be shown that the isolation when the switching circuit is off is:

*isolation* = 10 *log* $(P_{out}/P_{in})$

In the semiconductor switching circuit for the present invention, an input loss of less than 1 dB and an isolation loss of greater than 30 dB was attained at a frequency of 2 GHz. An input loss of less than 1 dB and an isolation of greater than 20 dB would be suitable for use in, for example, personal telephones.

Figure 4:
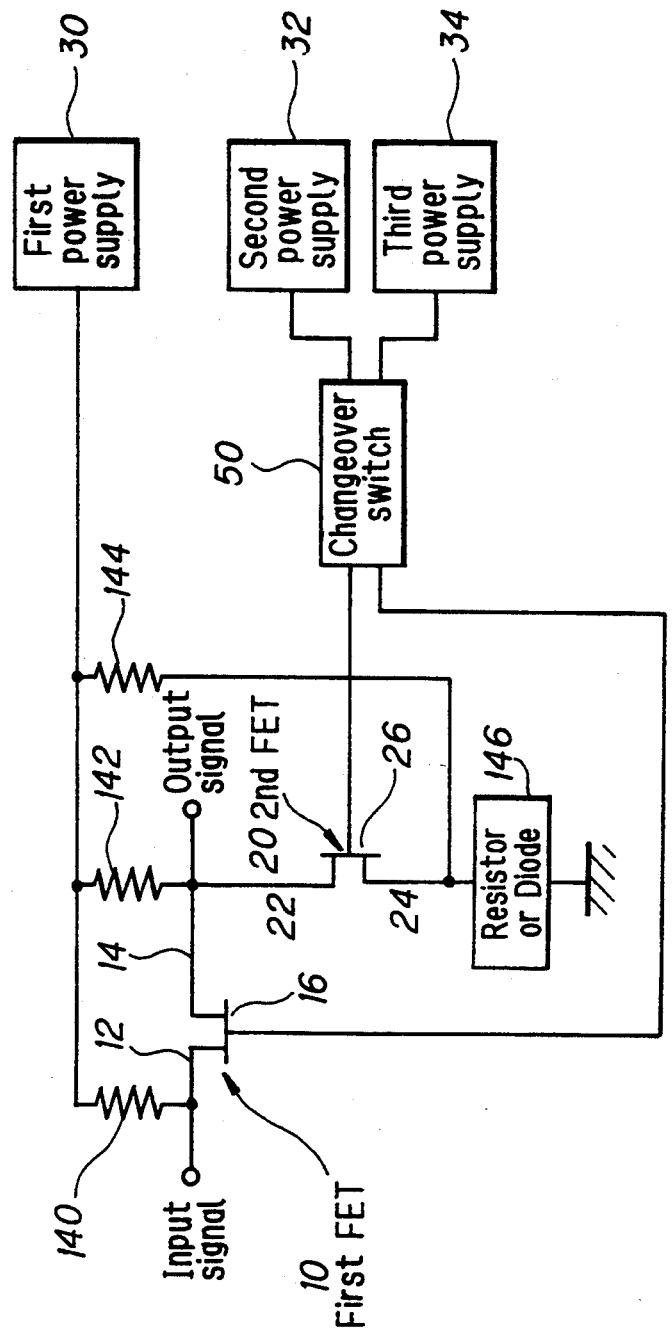
FIG. 4 is a diagram of an alternative embodiment of the semiconductor switching circuit of the present invention.

The semiconductor switching circuit for the present invention has been described above according to a preferred embodiment but this invention is by no means limited to this embodiment. For example as shown in FIG. 4, resistors 140, 142 and 144 could be used in place of the inductive elements 40, 42 and 44. Also, it would also be possible to use a diode or resistor 144 in place of the capacitor 46. JFETS made from various other materials could also be used in place of the GaAs JFETS. The voltages output by the first, second and third power supplies, the voltages for $V_b$ and $V_p$ and the values of the ferroelectric elements and the capacitor are to illustrate the example, and can be suitably modified, and the voltages output by each power supply could also be made negative. With the semiconductor switch in this invention, it is best for the voltage $V_b$ for the FETS to be set to the highest possible value and for the voltage $V_p$ to be set to the lowest possible value.

What is claimed is:

1. A semiconductor switching circuit comprising:
   first and second field effect transistors with built in voltage $V_b$ and pinch off voltage $V_p$;
   a first power supply for outputting a voltage $V_o$;
   a second power supply for outputting a voltage which is not lower than a sum of said voltages $V_o$ and $V_b$;
   a third power supply for outputting a voltage which is not higher than a sum of said voltages $V_o$ and $V_p$;
   a source terminal of said first field effect transistor being a signal input terminal of said switching circuit and a drain terminal of said first field effect transistor being a signal output terminal of said switching circuit;
   said output terminal being connected to source terminal of said second field effect transistor; and
   said first power supply being connected to the source terminals and drain terminals of said first and second field effect transistors;
   whereby when said first field effect transistor is on, a gate electrode of said first field effect transistor is connected to said second power supply and a gate electrode of said second field effect transistor is connected to said third power supply, and when said first field effect transistor is off, the gate electrode of said first field effect transistor is connected to said third power supply and the gate electrode of said second field effect transistor is connected to said second power supply.

2. A semiconductor switching circuit according to claim 1, wherein said voltage Vb is greater than or equal to 1 volt and said voltage $V_p$ is less than zero volts and greater than or equal to −1 volts.

3. A semiconductor switching circuit according to claim 1, wherein said first and second field effect transistors are junction type field effect transistors.

4. A semiconductor switching circuit according to claim 1, further comprising ferroelectric elements connected between the source terminals and the drain terminals of said first and second field effect transistors and said first power supply.

5. A semiconductor switching circuit according to claim 1, further comprising resistors connected between the source terminals and the drain terminals of said first and second field effect transistors and said first power supply.

6. A semiconductor switching circuit according to claim 1, further comprising a capacitor connected between the drain terminal of the second field effect transistor and earth.

7. A semiconductor switching circuit according to claim 1, further comprising a diode connected between the drain terminal of the second field effect transistor and earth.

8. A semiconductor switching circuit according to claim 1, further comprising a resistor connected between the drain terminal of the second field effect transistor and earth.

9. A semiconductor switching circuit according to claim 1, wherein input loss is less than 1 dB.

10. A semiconductor switching circuit according to claim 1, wherein isolation of said switching circuit is greater than 30 dB.

11. A semiconductor switching circuit according to claim 1, wherein said switching circuit is battery driven.

12. A semiconductor switching circuit, comprising:
a first field effect transistor (FET) having a first source, a first drain and a first gate, said first source serving as an input terminal and said first drain serving as an output terminal of said switching circuit;
a second field effect transistor (FET) having a second source connected to said first drain, a second drain connected to a signal ground and a second gate;
each said FET having a built in voltage $V_b$ and a pinch off voltage $V_p$;
biasing means for supplying a first DC voltage $V_o$ to each of said first and second sources, and said first and second drains; and
switching means for providing a voltage greater than or equal to $V_o + V_b$ to said first gate and a voltage of less than $V_o + V_p$ to said second gate when said first field effect transistor is in an on condition, and for providing a voltage greater than or equal to $V_o + V_b$ to said second gate and a voltage of less than $V_o + V_p$ to said first gate when said first field effect transistor is in an off condition.

13. The circuit of claim 12, wherein said biasing means includes a plurality of inductors coupled to a source of DC voltage.

14. The circuit of claim 13, wherein said source of DC voltage includes a battery.

15. The circuit of claim 12, wherein said first and second FETs are junction FETs (JFETs).

16. A semiconductor switching circuit, comprising:
a first junction field effect transistor (JFET) having a first source, a first drain and a first gate, said first source serving as an input terminal and said first drain serving as an output terminal of said switching circuit;
a second junction field effect transistor (JFET) having a second source a second drain, and second gate, wherein the second source is connected said first drain;
a capacitor connecting said second drain to ground; each said JFET having a built in voltage $V_b \geq 1$ volt and a pinch off voltage $V_p$ between 0 and $-1$ volts;
a battery supplying a first DC voltage $V_o$ of approximately 3 volts;
a first inductor coupling $V_o$ to said first source;
a second inductor coupling $V_o$ to said first drain and said second source;
a third inductor coupling $V_o$ to said second drain; and
switching means for providing a voltage greater than or equal to $V_o + V_b$ to said first gate and a voltage of less than $V_o + V_p$ to said second gate when said first junction field effect transistor is in an on condition, and for providing a voltage greater than or equal to $V_o + V_b$ to said second gate and a voltage of Less than $V_o + V_p$ to said first gate when said first junction field effect transistor is in an off condition.

* * * * *